(12) United States Patent
Brucchi

(10) Patent No.: US 9,648,776 B2
(45) Date of Patent: May 9, 2017

(54) ELECTRONIC MODULE, ELECTRONIC SYSTEM AND METHOD OF MANUFACTURING THE SAME

(71) Applicant: Infineon Technologies Austria AG, Villach (AT)

(72) Inventor: Fabio Brucchi, Villach (AT)

(73) Assignee: Infineon Technologies Austria AG, Villach (AT)

( * ) Notice: Subject to any disclaimer, the term of this patent is extended or adjusted under 35 U.S.C. 154(b) by 33 days.

(21) Appl. No.: 14/708,191

(22) Filed: May 9, 2015

(65) Prior Publication Data
US 2015/0327390 A1    Nov. 12, 2015

(30) Foreign Application Priority Data
May 12, 2014    (DE) .................. 10 2014 106 686

(51) Int. Cl.
| | | |
|---|---|---|
| H05K 1/14 | (2006.01) | |
| H05K 7/14 | (2006.01) | |
| H05K 3/36 | (2006.01) | |
| H05K 13/04 | (2006.01) | |

(52) U.S. Cl.
CPC .......... *H05K 7/1457* (2013.01); *H05K 1/141* (2013.01); *H05K 1/145* (2013.01); *H05K 3/36* (2013.01); *H05K 3/366* (2013.01); *H05K 13/04* (2013.01); *H05K 2201/10166* (2013.01); *Y10T 29/49128* (2015.01)

(58) Field of Classification Search
None
See application file for complete search history.

(56) References Cited

U.S. PATENT DOCUMENTS

| | | | | |
|---|---|---|---|---|
| 7,372,701 | B2 * | 5/2008 | Jacobson | ............... H05K 7/026 165/185 |
| 8,379,395 | B2 * | 2/2013 | Wetzel | .......................... 361/748 |
| 8,410,591 | B2 * | 4/2013 | Otremba | ............. H01L 23/4952 257/676 |
| 2004/0004818 | A1 * | 1/2004 | Kawakita | ........... H05K 7/20854 361/704 |
| 2007/0096278 | A1 * | 5/2007 | Nakatsu | .............. H01L 23/3675 257/678 |
| 2008/0268671 | A1 * | 10/2008 | Harris | .................. H01H 85/046 439/76.2 |

(Continued)

*Primary Examiner* — Xanthia C Cunningham

(57) ABSTRACT

An electronic module is provided, comprising an electronic chip arranged in the electronic module; at least two contact terminals electrically connected to the electronic chip each extending out of a package of the electronic module, wherein at least one of the at least two contact terminals is a signal contact terminal comprising a distal signal contact area, and at least another one of the at least two contact terminals is a power contact terminal comprising a distal power contact area; wherein the distal power contact area is adapted to be electrically connected to a power circuit external to the electronic module, wherein the external power circuit is oriented in a first plane; and wherein the distal signal contact area is adapted to be electrically connected to a signal circuit external to the electronic module, wherein the external signal circuit is oriented in a second plane extending perpendicular to the first plane.

14 Claims, 3 Drawing Sheets

(56) References Cited

U.S. PATENT DOCUMENTS

| | | | | |
|---|---|---|---|---|
| 2009/0142940 A1* | 6/2009 | Ikeda | H05K 1/18 | 439/76.2 |
| 2011/0037166 A1* | 2/2011 | Ikeda | H01L 23/3735 | 257/712 |
| 2013/0181228 A1* | 7/2013 | Usui | H01L 23/4334 | 257/77 |
| 2014/0117526 A1* | 5/2014 | Nishiuchi | H01L 23/473 | 257/693 |
| 2014/0124909 A1* | 5/2014 | Masunaga | H01L 23/495 | 257/666 |
| 2014/0339689 A1* | 11/2014 | Murase | H04B 1/48 | 257/664 |
| 2016/0190915 A1* | 6/2016 | Horiuchi | H02M 1/44 | 363/132 |

* cited by examiner

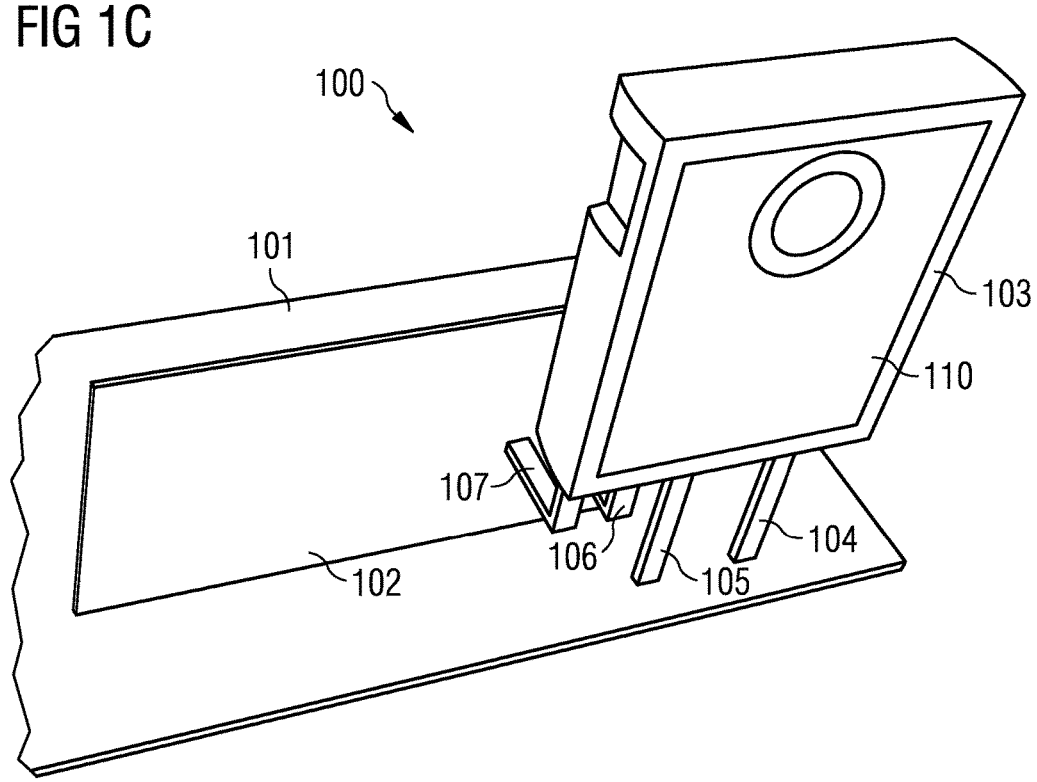

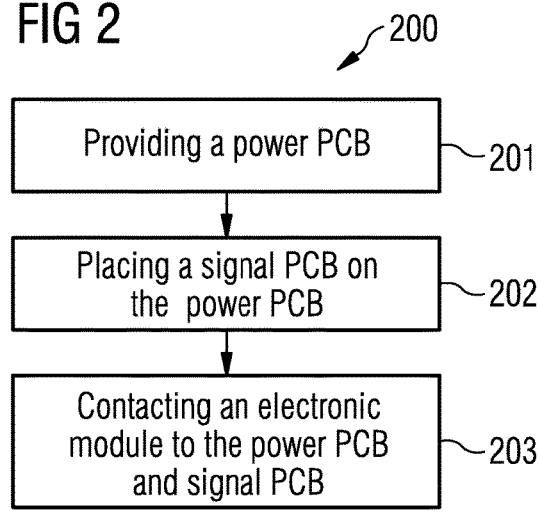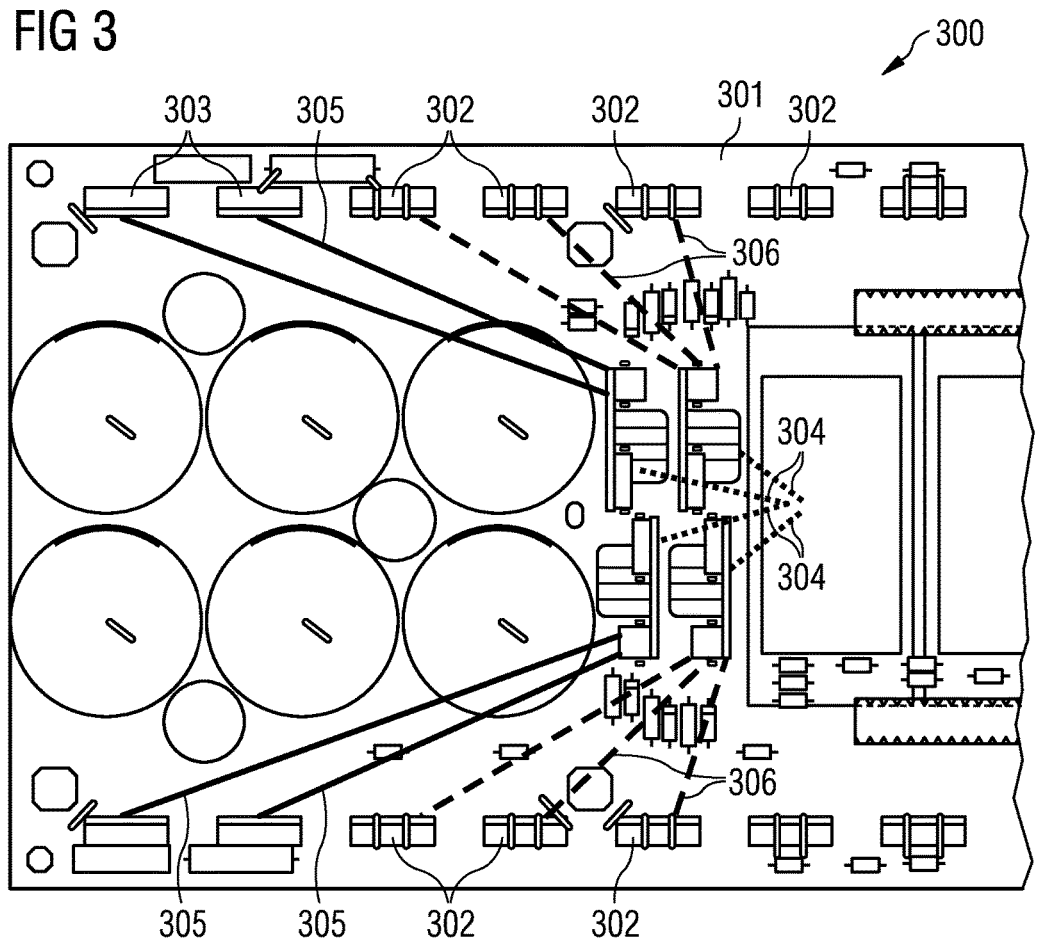

US 9,648,776 B2

ELECTRONIC MODULE, ELECTRONIC SYSTEM AND METHOD OF MANUFACTURING THE SAME

TECHNICAL FIELD

Various embodiments relate to an electronic module, an electronic system and method of manufacturing an electronic system.

BACKGROUND

In many technical fields electronic modules, e.g. so called power modules, are used for providing or switching power to electrical components or devices. One possible field is the automotive field or uninterruptible power supplies, for example. Most of the power modules comprise at least one transistor, e.g. an IGBT (insulated gate bipolar transistor) or a MOSFET. At the present state of the art the emitter (source) lead is used for both, signal and power connection capability. In this case, the resulting electronic system including the electronic module and a printed circuit board (PCB) is quite complicated, and the gate driver tracks have to be placed on the power board. The signal track must be routed on the same PCB leading to a complicated or complex layout which usually can be solved only using multi-layered PCB.

A principle layout of an electronic system 300 is shown in FIG. 3. The electronic system 300 comprises a PCB 301 on which a plurality of IGBTs or MOSFETs 302 and/or additional diodes 303 are mounted or placed. In addition, gate drivers or gate driver sub-units 304 are arranged on the PCB 301 which are connected to the IGBTS and/or MOSFETs. Signal connections between the gate driver 304 and outer switches (transistors/diodes) are indicated by solid lines 305 while signal connections between the gate driver 304 and inner switches are indicated by dashed lines 306. In FIG. 3 it can be seen that distances from the gate driver to devices/switches are large in particular, for the outer or upper devices/switches (solid lines).

SUMMARY

Various embodiments provide an electronic module, comprising an electronic chip arranged in the electronic module; at least two contact terminals electrically connected to the electronic chip each extending out of a package of the electronic module, wherein at least one of the at least two contact terminals is a signal contact terminal comprising a distal signal contact area, and at least another one of the at least two contact terminals is a power contact terminal comprising a distal power contact area, wherein the distal power contact area is adapted to be electrically connected to a power circuit external to the electronic module, wherein the external power circuit is oriented in a first plane; and wherein the distal signal contact area is adapted to be electrically connected to a signal circuit external to the electronic module, wherein the external signal circuit is oriented in a second plane extending perpendicular to the first plane.

Furthermore, various embodiments provide an electronic system, comprising an electronic module according to an exemplary embodiment; a power board; and a signal board, wherein the power board and the signal board are oriented with respect to each other that they are (substantially) perpendicular to each other, wherein the power contact area of the electronic module is electrically connected to the power board; and wherein the signal contact area of the electronic module is electrically connected to the signal board.

Moreover, various embodiments provide a method of manufacturing an electronic system, the method comprising providing a power board; placing a signal board on the power board in such a way that a main surface of the signal board is perpendicular to a main surface of the power board; and contacting an electronic module according to an exemplary embodiment to the power board and the signal board by contacting the power contact terminals to the power board and contacting the signal contact terminals to the signal board.

BRIEF DESCRIPTION OF THE DRAWINGS

In the drawings, like reference characters generally refer to the same parts throughout the different views. The drawings are not necessarily to scale. Instead emphasis is generally being placed upon illustrating the principles of the invention. In the following description, various embodiments are described with reference to the following drawings, in which:

FIGS. 1A to 1C show perspective views of an electronic system;

FIG. 2 shows a flowchart of a method of manufacturing an electronic system; and

FIG. 3 shows a schematic layout of an electronic system.

DETAILED DESCRIPTION

Figure 1A:
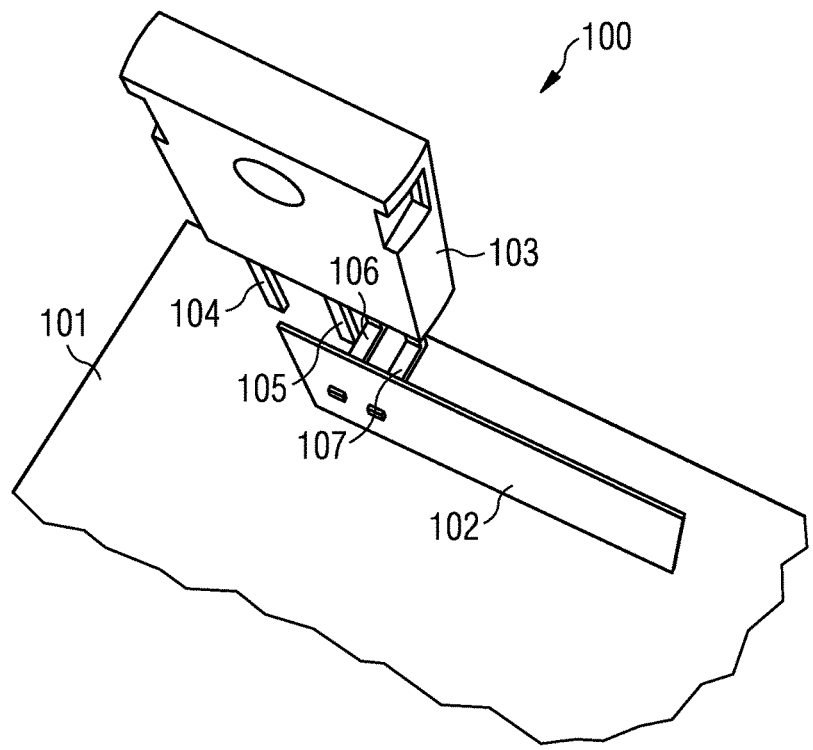

In the following further exemplary embodiments of an electronic module, an electronic system, and a method of manufacturing an electronic system will be explained. It should be noted that the description of specific features described in the context of one specific exemplary embodiment may be combined with others exemplary embodiments as well.

The word "exemplary" is used herein to mean "serving as an example, instance, or illustration". Any embodiment or design described herein as "exemplary" is not necessarily to be construed as preferred or advantageous over other embodiments or designs.

Various exemplary embodiments provide an electronic module comprising several contact terminals, in particular at least one power contact terminal and at least one signal contact terminal, leading or extending out of a package of the electronic module and comprising contact areas which are adapted to be contacted or connected to external circuitry extending in (substantially) perpendicular directions or orientations. An important feature of respective exemplary embodiments is that all contact terminals are either signal contact terminals or power signal terminals, i.e. none of the several contact terminals function as a signal interface and a power interface. For the contacting of the external circuitry the contact terminals may comprise (distal) contact areas.

In particular, all power contact areas may be adapted in the same way and all signal contact areas may be adapted in the same way. It should be noted that preferably the signal terminal(s) and the power terminal(s) are all distinct to each other in the sense that no hybrid terminals are used which are contacted to power and signal circuitry in the electronic chip and/or the external circuitry. Furthermore, all power contact terminal(s) and all signal contact terminal(s) may be adapted to be contacted into different directions to external circuitry.

This may lead to the fact that a board or similar substrate may be used for signal circuitry, therefore forming a signal board, and another separate board or substrate may be used for power circuitry, therefore forming a power board. Thus, it may be possible to clearly separate the power and the signal circuits or tracks from each other on the boards so that negative effects, e.g. some parasitic coupling between signal and power circuits, may be reduced. Furthermore, the layout or pattern of the circuitry on the boards may be simplified, potentially leading to the fact that the boards may need fewer layers. An electronic module according to an exemplary embodiment may enable that $E_{on}$ losses, electromagnetic interference (EMI) and/or coupling and gate stress caused by long tracks on the board may be reduced (because a signal loop or length of signal tracks may be reduced). Furthermore, costs may be reduced since the number of necessary layers of the board, like a printed circuit board, may be reduced, due to a possible separation of tracks or paths of the signal circuitry and the power circuitry. The separating of the two kinds of tracks (power/signal) may also significantly increase switching performances.

In particular, the distal power contact area may be a tip adapted to be surface mounted, i.e. may comprise a flat contact area extending at least substantially in a first plane having a first orientation, to an external circuit, e.g. formed on and/or in a board, e.g. a printed circuit board, or to a substrate or leadframe. Alternatively the distal power contact area may be a tip adapted to be plugged and/or soldered and/or through mounted to an external circuit, e.g. like a board.

In particular, the distal signal contact area may be a tip adapted to be surface mounted, i.e. may comprise an area extending at least substantially in a second plane having a second orientation, to an external circuit, e.g. formed on and/or in a board, e.g. a printed circuit board, or to a substrate or leadframe. Alternatively the distal signal contact area may be a tip adapted to be plugged and/or soldered and/or through mounted to an external circuit, e.g. like a board.

In particular, the electronic module may be a power module, i.e. a module adapted to switch, transmit, use or process currents higher than typically used for signal processing. For example, the electronic module and in particular, the power circuits of the electronic chip and/or the external circuitry may be adapted to withstand more than 40 A. The electronic module may be used in an electronic system like an uninterruptible power supply (UPS).

In particular, each of the contact terminals may be either a signal contact terminal or a power contact terminal. That is, none of the contact terminals may be a hybrid terminal used for signals and power.

In that sense, the term "power terminal" may particularly denote a terminal, pin or interface which is connected to a power loop or power circuitry in the electronic module, e.g. the electronic chip of the electronic module. In particular, such a power contact terminal may be adapted to withstand a voltage of more than 200 V and/or transmit a current of several ampere up to more than 40 A, e.g. 100 A. Such a "power terminal" has to be distinguished from a "signal terminal" which may particularly denote a terminal, pin or interface which is connected to a signal loop or signal circuitry in the electronic module, e.g. the electronic chip of the electronic module. Such a signal contact terminal may only be adapted to withstand a voltage of below 100 V and/or transmit a current of less than 10 A.

In the following exemplary embodiments of the electronic module are described. However, the features and elements described with respect to these embodiments can be combined with exemplary embodiments of the electronic system and the method of manufacturing the electronic system as well.

According to an exemplary embodiment the electronic module comprises four contact terminals, wherein two are signal contact terminals and the other two are power contact terminals.

For example, the second signal contact terminal may be formed in the same way as the at least one signal contact terminal, and the second power contact terminal may be formed in the same way as the at least one power contact terminal. In particular, the second signal contact terminal and the second power contact terminal may comprise each a distal contact area adapted in the same way as the ones of the at least one signal contact terminal and the at least one power contact terminal.

According to an exemplary embodiment of the electronic module the at least two contact terminals exiting the package at the same side and either the signal contact terminal or the power contact terminal comprises a bent having an angle of (substantially) 90 degrees.

For example, one of the contact terminals, e.g. the power contact terminal, may be a straight lead while the other one, e.g. the signal contact terminal, may comprise a bent. Such a provision of a bent lead may result in the fact that the electronic module is adapted in such a way that the signal contact terminal and the power contact terminal are adapted to be connected to external circuits or circuitry extending in planes which are perpendicular or at least substantially perpendicular with respect to each other.

According to an exemplary embodiment of the electronic module the at least one power contact terminal and the at least one signal contact terminal exit the package on different sides which are perpendicular to each other.

In case the power contact terminal(s) and the signal contact terminal(s) exit the package on different sides it may be possible to have straight leads for both contact terminals while still enabling that the respective contact areas are still adapted to be contacted to circuits, e.g. formed in respective boards, which extend into different directions particularly into directions which are perpendicular or at least perpendicular to each other.

According to an exemplary embodiment of the electronic module the electronic chip comprises at least one transistor and the at least one signal contact terminal is connected to a switching contact of the transistor and the at least one power contact terminal is connected to a switched contact of the transistor.

The at least one transistor may be an IGBT or a FET, like a MOSFET. In particular, the electronic module may comprise a plurality of transistors, e.g. power transistors, to enable the switching and/or processing of a higher current or amount of power. The plurality of transistors may be formed by IGBTs and/or MOSFETs. The switching contact of the transistor may be a gate contact, while in case of an IGBT the switched terminal contact may be an emitter or collector contact and in case of a FET or MOSFET transistor the switched contact may be a source/drain contact.

According to an exemplary embodiment of the electronic module the at least two contact terminals are formed by predefined leads of a leadframe.

In particular, the electronic chip of the electronic module may be arranged or placed on a leadframe, e.g. a chip reception area of the leadframe. Such a leadframe may comprise predefined leads which are then used for forming the leads or contact terminals by cutting or otherwise processing the leadframe after an array of electronic modules has been manufactured on the leadframe. For example, the electronic module may be a packaged electronic module comprising an encapsulation formed by a molding compound or the like.

In the following exemplary embodiments of the electronic system are described. However, the features and elements described with respect to these embodiments can be combined with exemplary embodiments of the electronic module and the method of manufacturing the electronic system as well.

According to an exemplary embodiment of the electronic system the power board is a printed circuit board.

According to an exemplary embodiment of the electronic system the signal board is a printed circuit board.

According to an exemplary embodiment of the electronic system the at least one power contact terminal and the at least one signal contact terminal exiting the electronic module at the same side; and the signal contact terminal comprises a bent of 90 degrees while the power contact terminal is formed by a straight lead.

It should be noted that in other embodiments the signal contact terminals may be formed by straight leads or contacts while the power contact terminals may be bent.

In particular, the at least two or all contact terminals may be formed by leads of a leadframe. After arranging at least one electronic chip, e.g. on the leadframe, and optional further electric electronic chips and/or electronic circuitry, the electronic components of the electronic module may be encapsulated by an encapsulating material, like mold, epoxy or the like.

According to an exemplary embodiment of the electronic system the at least one power contact area is soldered to the power board.

In particular, all provided power contact terminals having power contact areas may be soldered to the power board. Alternatively, they may be attached or contacted to the power board by any other suitable process, e.g. by using adhesives and/or bonding and/or respective surface mounting technologies. The same processes may be used for the signal contact terminals or areas as well. In particular, both types of contact terminals or contact areas may be contacted or connected to the respective boards by the same or different processes.

According to an exemplary embodiment the electronic system further comprises a plurality of electronic modules.

In particular all of the electronic modules may be formed according to an exemplary embodiment, i.e. comprising contact terminals which are distinct from each other concerning their adaptation with respect to power and signal transmitting.

Summarizing an electronic system may be provided according to an exemplary embodiment, which exploits the capabilities of an electronic module comprising separated leads for power and signal and a gate driver sub-unit PCB arranged perpendicular or at least substantially perpendicular to a power PCB. These capabilities particularly include the possibility to create an alternative signal path or track closer to the device's gates which signal path is completely separated or split from the power path. Due to the complete separation of the signal and power path it may be possible to simplify the total system, avoiding EMI and routing coupling, and increasing switching performances of the electronic system, e.g. power system like an uninterruptible power system.

In the following an exemplary embodiment of an electronic module and electronic system according to an exemplary embodiment is described in connection with the figures.

In particular, FIG. 1 depicts schematically perspective views of a portion of an electronic system 100. In particular, FIG. 1A shows the electronic system 100 which comprises a first PCB 101, which functions as a power PCB. On a main surface of the power PCB 101 a second PCB 102 is arranged having a main surface which is arranged substantially perpendicular to the main surface of the power PCB 101. The second PCB functions as a signal PCB, i.e. comprises signal paths or tracks adapted to provide and/or receive control signals. For example, gate drivers and/or other control elements may be arranged on the signal PCB 102.

Furthermore, electronic system 100 comprises an electronic module 103 having four contact terminals 104 to 107 which may be formed by leads of a leadframe of the electronic module 103. Two of the contact terminals (104 and 105) are power contact terminals, i.e. adapted to withstand currents which are higher than typical control signals used. In the embodiment shown in FIG. 1 the electronic module 103 comprises at least one electronic chip or electronic compound (not shown) like a transistor (IGBT and/or MOSFET). In case of an IGBT the two power contact terminals may be a collector 104 and a power emitter 105.

Furthermore, the other two contact terminals (106, 107) of the electronic module form signal contact terminals and exiting the packaged electronic module on the same side as the two power contact terminals. However, the two signal contact terminals are formed not by straight leads but comprise each a bent changing the direction of the leads substantially by 90 degrees. The two signal contact terminals 106 and 107 form a signal emitter and a gate terminal, respectively, in the embodiment shown in FIG. 1. However, it should be noted that the IGBT described in the context of FIG. 1 may as well be replaced by a MOSFET in which case the four contact terminals may form source/drain terminals instead of collector/emitter terminals. It should further be noted that the signal and power paths or tracks and thus also the respective contact terminals are separated from each other in layout and function. That is, the power contact terminals and the respective power circuitry are electrically separated or isolated from the signal contact terminals and the respective signal circuitry.

The two power contact terminals may be directly soldered to the power PCB 101. As well the signal contact terminals having the bent of approximately 90 degrees may be soldered or otherwise directly contacted to the signal PCB forming a gate driver PCB. Due to the bent of the signal contact terminals 106 and 107 the respective terminals can be easily contacted to the signal PCB and it may be possible to avoid complex routing on the power PCB which complex routing is typically caused by signal tracks on the power PCB. In addition, the separation or splitting of power and signal tracks by forming these on distinct PBCs may reduce power loop oscillations, electromagnetic interference (EMI), gate stress and may also reduce $E_{on}$ losses.

Figure 1B:
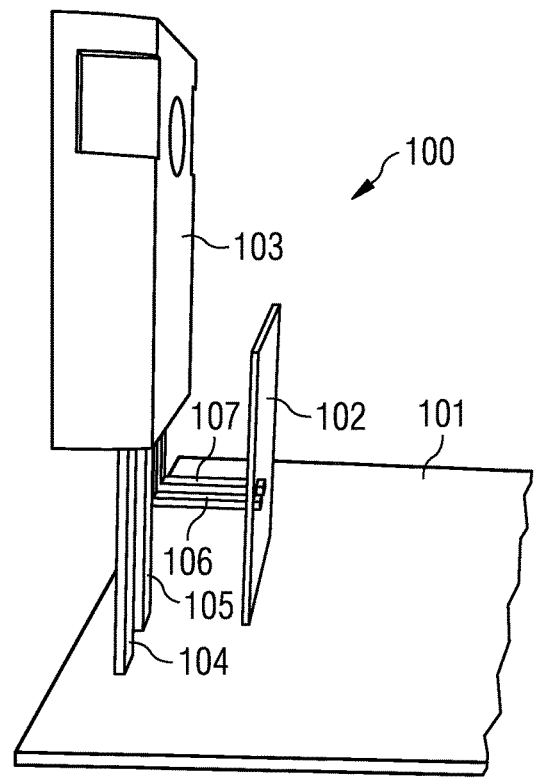

FIG. 1B shows the embodiment of FIG. 1A in a perspective side view clearly showing the easy to produce connection of the bent signal contact terminals 106 and 107 to the signal or gate driver sub-unit PCB 102 being arranged on the power PCB 101. Contrary to the bent signal contact terminals 106 and 107 the power contact terminals 104 and 105 of the electronic module 103 are connected in a straight line with the power PCB 101.

FIG. 1C shows the embodiment of FIGS. 1A and 1B from the backside so that an exposed portion of a leadframe 110, parts of which form the four contact terminals 104 to 107, of the electronic module 103 can be seen. The exposed portion of the leadframe 110 may function as a heatsink as well.

It should be noted that the example shown in FIG. 1 is only exemplarily. In particular, in other embodiments the signal contact terminals may be straight while the power contact terminals may be bend. In this case the signal PCB may rather be horizontally arranged while the power PCB may then be vertically arranged on the signal PCB. In addition, a plurality of electronic modules may be arranged on the PCB, i.e. the electronic system may comprise a plurality of components. It should be noted that the size of the PCBs may then be adapted to the number of components. As well it should be noted that the contact terminals may not necessarily arranged on the same side of the electronic module but may extend out of the electronic module on different sides which may avoid the necessity of bending either the signal or the power contact terminals.

FIG. 2 shows a flowchart of a method of manufacturing an electronic system. In particular, the method or process 200 comprises a providing a power board, e.g. a suitable PCB (step 201). Afterwards a signal board is placed on the power board in such a way that a main surface of the signal board is perpendicular to a main surface of the power board (step 202). In addition, an electronic module is contacted to the power board and the signal board by contacting the power contact terminals to the power board and contacting the signal contact terminals to the signal board (step 203).

It should be noted that the term "comprising" does not exclude other elements or features and the "a" or "an" does not exclude a plurality. Also elements described in association with different embodiments may be combined. It should also be noted that reference signs shall not be construed as limiting the scope of the claims. While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. An electronic module, comprising:
an electronic chip arranged in the electronic module;
at least two contact terminals electrically connected to the electronic chip each extending out of a package of the electronic module,
wherein at least one of the at least two contact terminals is a signal contact terminal comprising a distal signal contact area, and at least another one of the at least two contact terminals is a power contact terminal comprising a distal power contact area;
wherein the distal power contact area is adapted to be electrically connected to a power circuit external to the electronic module, wherein the external power circuit is oriented in a first plane;
wherein the distal signal contact area is adapted to be electrically connected to a signal circuit external to the electronic module, wherein the external signal circuit is oriented in a second plane extending perpendicular to the first plane; and
wherein the at least one power contact terminal and the at least one signal contact terminal exit the package of the electronic module at the same side and either the signal contact terminal or the power contact terminal comprises a bent having an angle of 90 degrees while the other one of the signal contact terminal or the power contact is formed by a straight lead.

2. The electronic module according to claim 1, comprising four contact terminals, wherein two are signal contact terminals and the other two are power contact terminals.

3. The electronic module according to claim 1, wherein the electronic chip comprises at least one transistor and the at least one signal contact terminal is connected to a switching contact of the transistor and the at least one power contact terminal is connected to a switched contact of the transistor.

4. The electronic module according to claim 1,
wherein the at least two contact terminals are formed by predefined leads of a leadframe.

5. An electronic system comprising:
an electronic module according to claim 1;
a power board; and
a signal board,
wherein the power board and the signal board are oriented with respect to each other that they are perpendicular to each other;
wherein the power contact area of the electronic module is electrically connected to the power board; and
wherein the signal contact area of the electronic module is electrically connected to the signal board.

6. The electronic system according to claim 5, wherein the power board is a printed circuit board.

7. The electronic system according to claim 5, wherein the signal board is a printed circuit board.

8. The electronic system according to claim 5,
wherein the signal contact terminal comprises a bent of 90 degrees while the power contact terminal is formed by a straight lead.

9. The electronic system according to claim 5,
wherein the at least one power contact area is soldered to the power board.

10. The electronic system according to claim 5, further comprising a plurality of electronic modules.

11. The electronic system according to claim 5, wherein the power contact terminal comprises a bent having an angle of 90 degrees while the signal contact terminal is formed by a straight lead.

12. A method of manufacturing an electronic system, the method comprising:
providing a power board;
placing a signal board on the power board in such a way that a main surface of the signal board is perpendicular to a main surface of the power board; and
contacting an electronic module according to claim 1 to the power board and the signal board by contacting the power contact terminals to the power board and contacting the signal contact terminals to the signal board.

13. The electronic module according to claim 1, wherein the signal contact terminal comprises a bent having an angle of 90 degrees while the power contact terminal is formed by a straight lead.

14. The electronic module according to claim 1, wherein the power contact terminal comprises a bent having an angle of 90 degrees while the signal contact terminal is formed by a straight lead.

* * * * *